United States Patent [19]

Simonsen

[11] Patent Number: 5,047,961
[45] Date of Patent: Sep. 10, 1991

[54] AUTOMATIC BATTERY MONITORING SYSTEM

[76] Inventor: Bent P. Simonsen, 27 Starfish Ct., Newport Beach, Calif. 92663

[21] Appl. No.: 446,023

[22] Filed: Jan. 17, 1990

Related U.S. Application Data

[63] Continuation-in-part of Ser. No. 199,684, May 31, 1988, abandoned.

[51] Int. Cl.[5] .......................... G08B 21/00; H02J 7/04
[52] U.S. Cl. .................................. 364/550; 364/483; 340/636; 320/48; 320/6
[58] Field of Search ................... 364/550, 551.01, 483; 340/636; 324/427-436; 320/6, 48, 39

[56] References Cited

U.S. PATENT DOCUMENTS

| | | | |
|---|---|---|---|
| 4,290,109 | 9/1981 | Taniguchi et al. | 364/483 X |
| 4,423,379 | 12/1983 | Jacobs et al. | 324/429 |
| 4,525,055 | 6/1985 | Yokoo | 340/636 X |
| 4,595,880 | 6/1986 | Patril | 324/427 |
| 4,707,795 | 11/1987 | Alber et al. | 364/550 |
| 4,709,202 | 11/1987 | Koenck et al. | 320/39 X |
| 4,743,831 | 5/1988 | Young | 340/636 X |
| 4,743,855 | 5/1988 | Randin et al. | 340/636 X |
| 4,876,513 | 10/1989 | Brilmyer et al. | 320/48 X |
| 4,888,716 | 12/1989 | Ueno | 340/636 |
| 4,914,393 | 4/1990 | Yoshido | 324/431 X |
| 4,965,738 | 10/1990 | Bauer | 364/550 X |

*Primary Examiner*—Joseph L. Dixon
*Attorney, Agent, or Firm*—Plante, Strauss, Vanderburgh & Connors

[57] ABSTRACT

There is disclosed an instrument for the continuous monitoring of emergency stand-by batteries during operation of the batteries. The invention monitors the emergency batteries during all discharge operations and records the usage and conditions of the batteries as well as alerts the operators when the discharge voltage of the batteries falls below the minimum required for the particular application. The instrument includes voltage, current and temperature sensors which generate signals that are applied through gain amplifiers to an analog to digital converter and then to a central processing unit. The central processing unit receives a reference voltage and has an independent emergency power supply. The central processing unit outputs signals to a liquid crystal display as well as to a printer and receives commands from a key pad. The central processor unit is supplied with a software operating program which is recorded on a ROM and has system RAM for non-volatile storage and a clock. The instrument is programed to record battery usage in total accumulated numbers of battery discharges of greater than one or more preset durations, total accumulated time (duration) of battery discharges, total accumulated battery discharge power (KW Hours) as well as recording charging information such as the battery float voltage, the ambient temperature of the batteries, and the recharge current and voltage during the initial recharge periods. This information is printed every 24 hours and after every battery discharge.

8 Claims, 6 Drawing Sheets

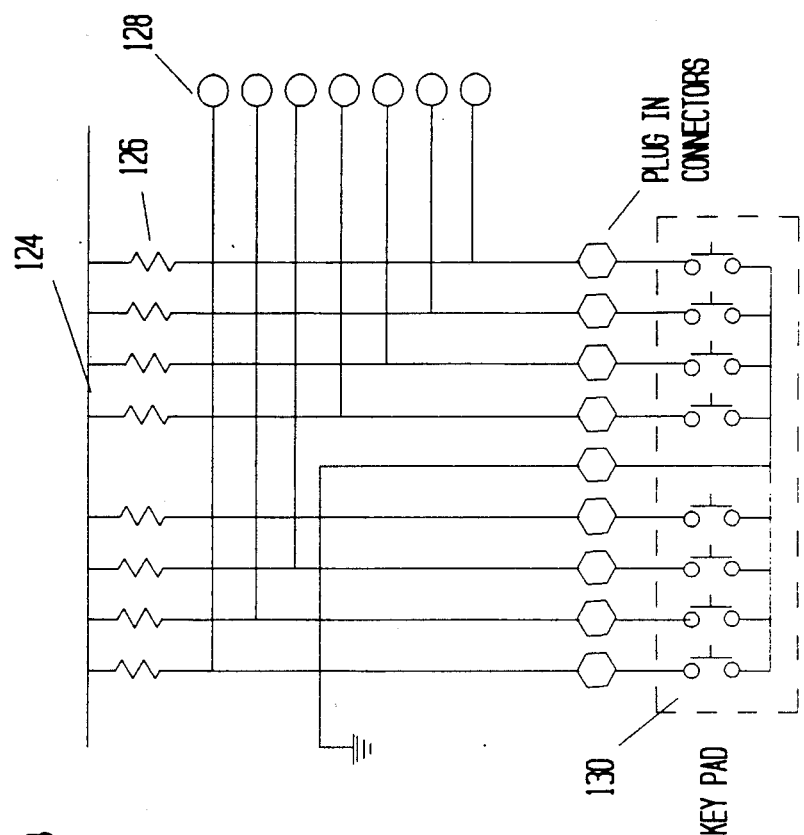
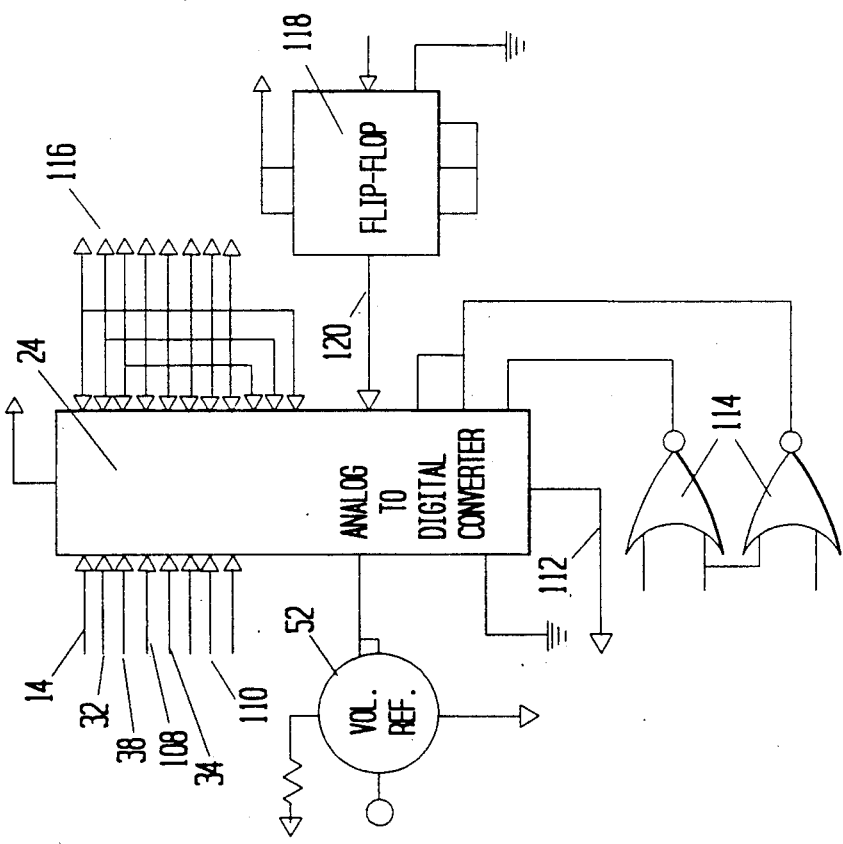

AUTOMATIC BATTERY MONITORING SYSTEM

RELATIONSHIP TO OTHER APPLICATIONS

This application is a continuation-in-part of my copending application, Ser. No. 07/199,684, filed May 31, 1988, now abandoned.

FIELD OF THE INVENTION

This invention relates to a monitoring system for stand-by batteries, and, in particular, to a monitoring system for batteries used in uninterruptible power supplies (UPS).

BRIEF STATEMENT OF THE PRIOR ART

Uninterruptible power supplies (UPS) with stand-by batteries are commonly used with equipment in which interruption of the electrical power supply to the equipment could result in a catastrophic loss. An example of such equipment is that for computer control and operations. The down time, expense and inconvenience incurred upon loss of power to many applications is tremendous. Computers are utilized in just about every phase of industry, including the operation of immense computer rooms, communication systems, power generators, oil refineries and the like. Upon a power failure, the computers will be inoperative unless alternative power systems are provided. Furthermore, if power is lost to a computer, there may be considerable problems connected with returning such computers to regular operation and possible damage to one or more of the computer components.

Accordingly, such critical electrical equipment is now safeguarded from the foregoing power failure problems by installation of a UPS system including a series of batteries which are automatically discharged and provide power upon failure of the regular line AC power. The batteries used for such uninterruptible power supplies are rechargeable, and can be a variety of lead-acid or nickel cadmium cells. A typical application could include 120 to 200 cells.

One problem that exists is the need to monitor the parameters of the alternate battery power source during each discharge to insure that the battery power source does not fail itself when required to safeguard the critical electrical equipment. There exists a great need in the art to provide a practical method of testing and displaying such test results so that the operator can ascertain the usage and condition of the alternate power source after each battery discharge.

One battery testing and monitoring system is described in U.S. Pat. No. 4,707,795. In the system described in the aforesaid patent, the emergency batteries are periodically subjected to a standard test load and the condition of the batteries is monitored during discharge on the standard test load. A difficulty with this testing is that the batteries must be taken off-line during the monitoring process and the system is thus subjected to potential failure in the event of interruption of the AC power supply during the testing procedure.

An additional requirement with the emergency power supplies is that there is need to maintain an accurate record of the usage and conditions of charging and discharging of the emergency batteries, frequently required by the manufacturer for warranty servicing and/or replacement of batteries. The battery manufacturers require that accurate data be kept on the number of battery discharges which exceed minimum durations, an accumulative total of discharge time, battery temperature, etc. None of the systems which have been supplied for monitoring of batteries has, heretofore, been furnished with recording capability of the various parameters required by the manufacturers to meet warranty requirements.

OBJECTS OF THE INVENTION

It is an object of this invention to provide an apparatus and method for monitoring the usage and condition of batteries without the necessity to remove the batteries from service.

It is also an object of the invention to provide a battery monitoring system that will monitor battery usage and condition during battery discharge.

It is an additional object of this invention to provide a battery monitoring system which will record the parameters of battery usage required by manufacturers to meet warranty conditions.

It is an object of the invention to provide a continuous battery monitor system which indicates and records the usage and condition of emergency stand-by batteries.

It is a further object of the invention to provide an apparatus for recording conditions and durations of battery usage.

It is further object of the invention to provide a method for recording battery charge information.

BRIEF SUMMARY OF THE INVENTION

The invention is an instrument for the continuous monitoring of emergency stand-by batteries during operation of the batteries. The invention monitors the emergency batteries during all discharge operations and records the conditions of the batteries as well as alerts the operators when the discharge voltage of the batteries falls below the minimum required for the particular application. The instrument includes voltage, current and temperature sensors which generate signals that are applied through gain amplifiers to an analog to digital converter and then to a central processing unit. The central processing unit receives a reference voltage and has an independent emergency power supply. The central processing unit outputs signals to a liquid crystal display as well as to a printer and receives commands from a key pad. The central processor unit is supplied with a software operating program which is recorded on a ROM and has system RAM for non-volatile storage and a clock.

The instrument records the voltage and current of the batteries during all discharge operations and will sound an alarm to alert the operator when the voltage of the batteries falls below a preset, minimum level responding to the minimum voltage for the critical load of the batteries. The instrument also records battery usage in total accumulated numbers of battery discharges of greater than one or more preset durations, total accumulated time (duration) of battery discharges, total accumulated battery discharge power (KW Hours) as well as recording charging information such as the battery float voltage, the ambient temperature of the batteries, and the recharge current and voltage during the initial recharge periods. This information is printed every 24 hours and after every battery discharge.

BRIEF DESCRIPTION OF THE DRAWINGS

The invention will be described with reference to the Figures of which:

FIG. 4 is a diagram of the analog to digital convertor used in the invention;

FIG. 5 is a circuit diagram of the keypad used in the invention;

FIG. 8 is a sample of a 24 hour print out tape;

FIG. 9 is a sample of a discharge print out tape;

FIG. 10 is a sample of a test print out tape;

DESCRIPTION OF PREFERRED EMBODIMENTS

Figure 1:
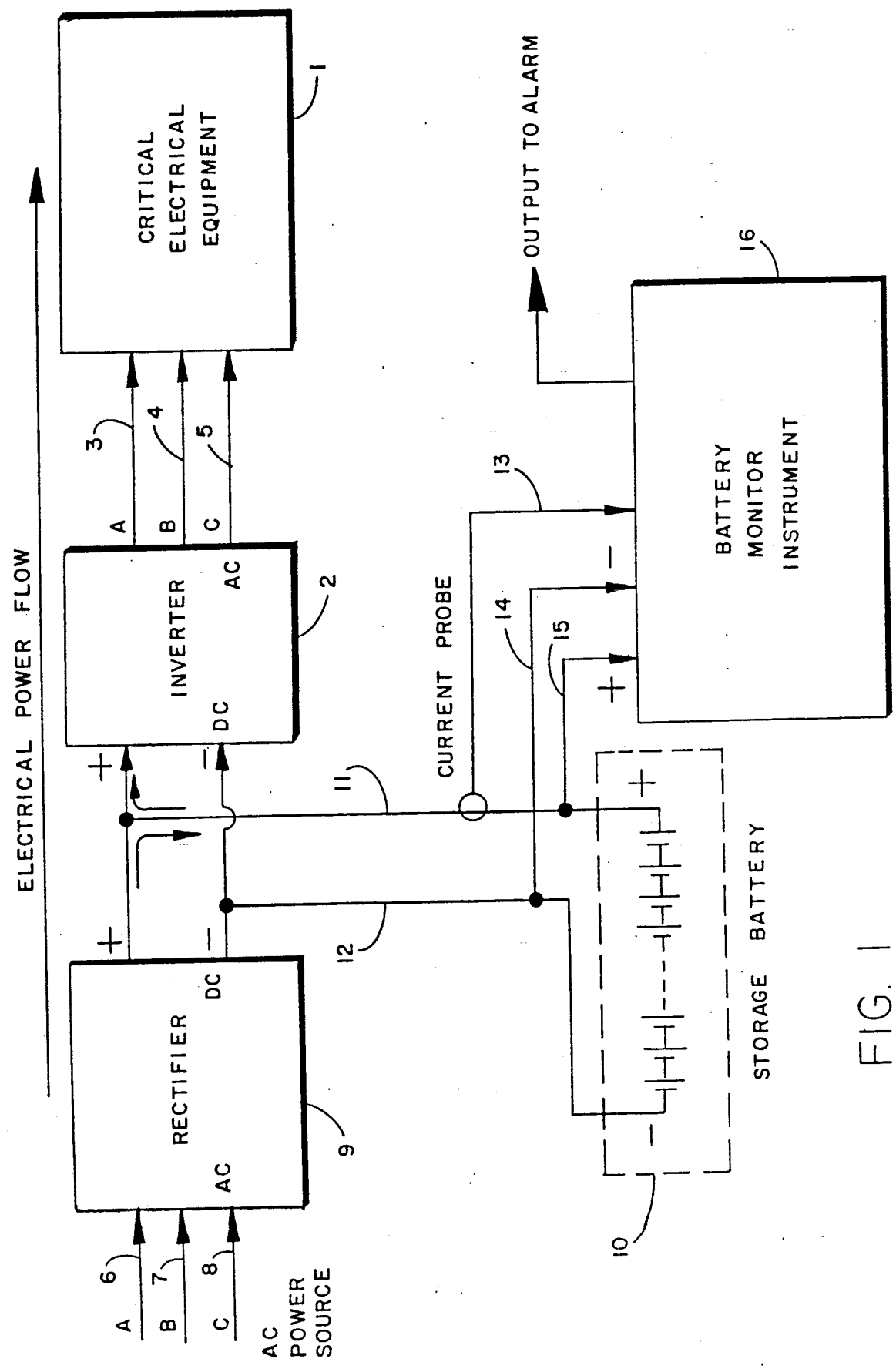
FIG. 1 is an illustration of a typical installation of an uninterrupted power supply.

Referring now to FIG. 1, there is shown the critical electrical equipment 1, which may be a computer or other known electrical equipment, which utilizes alternating (AC) current.

An invertor 2 is shown which converts direct current to alternating current as shown for feeds 3, 4 and 5 to the critical electrical equipment 1. During normal operation, power is received from an AC power source using lines 6, 7 and 8. The power passes through a rectifier 9, and through the invertor 2. The rectifier converts alternating current to direct current, and the invertor converts direct current into alternating current.

When there is a failure of the AC power source, power is provided from the storage battery 10, which is a bank of rechargeable wet or gel type cells. Power flows from storage batteries 10 through line 11 into the invertor, which converts the direct current of the batteries to alternate current for use by the critical electrical equipment 1.

The storage battery 10 can comprise multiple batteries in series. There can be from 6 to 300, typically from 24 to 250, and usually from 100 to 200 cells in series to provide the voltage and current required by the critical electrical equipment 1. The typical nominal voltage per battery cell is two volts, however, premature battery failure can occur, hence, the necessity of the invention herein.

As indicated, when there is a failure of the normal AC power source, power is automatically provided from the storage battery or series of cells 10. The batteries are normally sized to provide power for a relatively short period of time, i.e., ten to thirty minutes, until alternate power sources, such as engine generators, can be brought on line, or necessary repairs or adjustments made to the normal power source.

FIG. 1 shows a current probe 13 connected to line 11, and probes 14 and 15 connected to lines 12 and 11 respectively, which are connected to a battery monitor instrument 16. The battery monitor instrument contains well known electronic circuits such as a digital electronic volt meter, a digital ammeter, a digital electronic clock, showing the year, month, day, hour, minute and second, and an electronic detector to sense discharge start/stop circuits, and/or an electronic interface circuit with micro-processor and software programming. The essential element of the invention herein, is that the battery voltage, current and ambient temperature are being continually printed out together with elapsed time during each battery discharge. The printed recording can then be examined and accurate battery performance data can be ascertained after each battery discharge. As indicated hereinabove, the operator can be so informed as to the time of each discharge, thus time of normal AC power failure, and as to the ambient temperature during such failure. Declining battery performance can be detected so that the battery, or individual batteries in a series of batteries, can be serviced, repaired and/or replaced to eliminate or minimize battery failure during the discharge mode.

Figure 2:
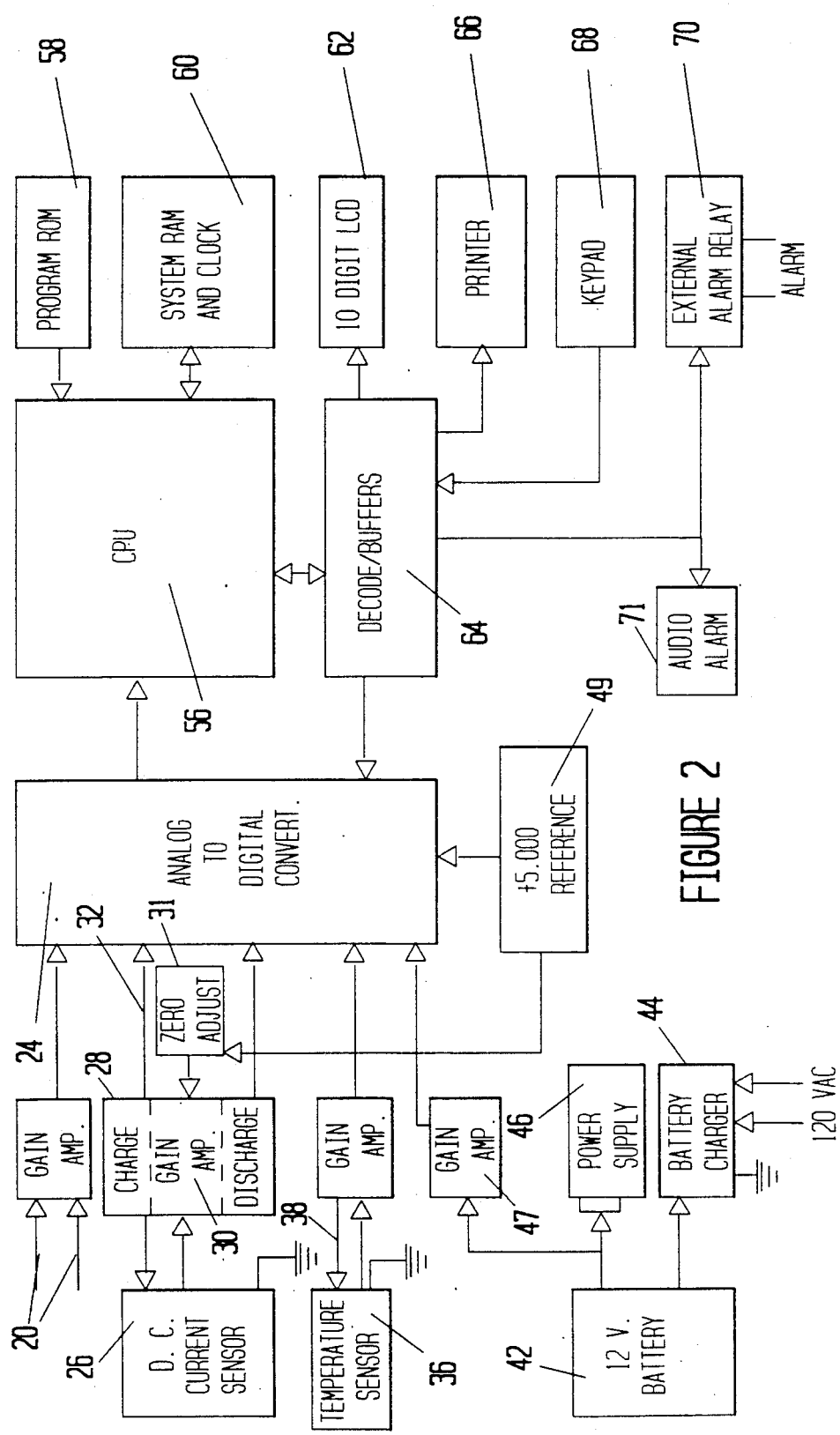
FIG. 2 is a block diagram of the battery monitoring instrument of the invention.

Referring now to FIG. 2, the instrument of the invention is shown in a block diagram. In this instrument, test probes 20 which extend to the battery are applied through a gain amplifier 22 which is normally set at a 100/1 gain down to reduce the sensed battery voltage (which typically ranges from 48 to 600 volts) to a value from 1 to 5 volts for the instrument operation. The step down voltage is applied to the analog to digital convertor 24 which is National Semiconductor part No. ADC 808.

The instrument also monitors the current flow in the battery supply circuit and for this purpose, a clamp-on Hall-effect current sensor 26 is used. The current sensor 26 is typically clamped around all or a selected portion of the emergency power supply. The installation is described in greater detail hereinafter with reference to FIGS. 11 and 12. The signal generated by the current sensor 26 is applied to a current discriminator 28 which has a gain amplifier 30 and which discriminates between charging and discharging current. The charging and discharging current signals from the gain amplifier are fed through separate leads 32 and 34 to the analog to digital convertor 24.

The instrument also has a temperature sensor 36 which is located in the room housing the emergency batteries. The temperature sensor 36 can be a solid state, temperature-sensitive, semi-conductor which generates a voltage signal responsive to the ambient temperature. This signal is generated by the application of power through line 38 from the instrument to the temperature sensor 36 and the temperature signal is returned through a gain amplifier 40 that adjusts the voltage to the 1 to 5 volt range of the instrument. The adjusted voltage signal is then applied to the analog to digital convertor 24.

The instrument is supplied with its own emergency battery or power supply and for this purpose a 12-volt battery 42 is supplied which has a battery charger 44. The electrical power for normal operation (120 volts AC) of the instrument is received from the line voltage, and the power supply 46 generates an operating voltage that is supplied to a gain amplifier 48 to reduce the voltage to the +5 volts operating voltage of the system. The power supply is also operative to maintain the 12-volt emergency or stand-by battery 42 of the instrument, as indicated by line 50.

The analog to digital convertor 24 is provided with a 5-volt reference signal that is developed at the reference voltage source 49 which also generates a 2.5 v (voltage)

reference which is applied to the current discriminator 28 through a zero adjust circuit 31 which includes an adjustable potentiometer. The potentiometer is adjustable by field technicians and is not a user adjustment feature.

The analog to digital convertor 24 generates a signal that is applied to the micro-processor 56. The micro-processor 56 also receives the operating software from the program ROM 58 and has a system ram 60 which comprises non-volatile storage which has an internal battery (not shown). The battery also provides emergency power to a real time clock. Typically this non-volatile storage has a sufficiently stable battery and power supply to provide for 3 years emergency stand-by operation.

The instrument shown in FIG. 2 is intended for on site monitoring of batteries, and includes a printer, display, and keypad with the necessary buffers and drivers, described hereinafter. It can also be readily adapted for integration into an existing computer at a customer's location by providing an RS-232 I/O port for cabling to the serial port of the customer's computer, or to a phone modem, to transmit and receive data with a remotely located computer over conventional phone lines. The preferred embodiment, however, is illustrated with an integral printer and keypad, as this is the most common installation.

The instrument has a 10 digit liquid crystal display 62 that is driven by logic from the decoder and buffers 64. The decoder and buffers 64 also have the necessary amplifiers and logic to drive the printer 66. The instrument has a key pad 68 for calibration and for normal operational functions. Finally, the instrument has an external alarm 70 as well as an audio alarm, both of which are driven through the decoder and buffers 64.

Figure 3:
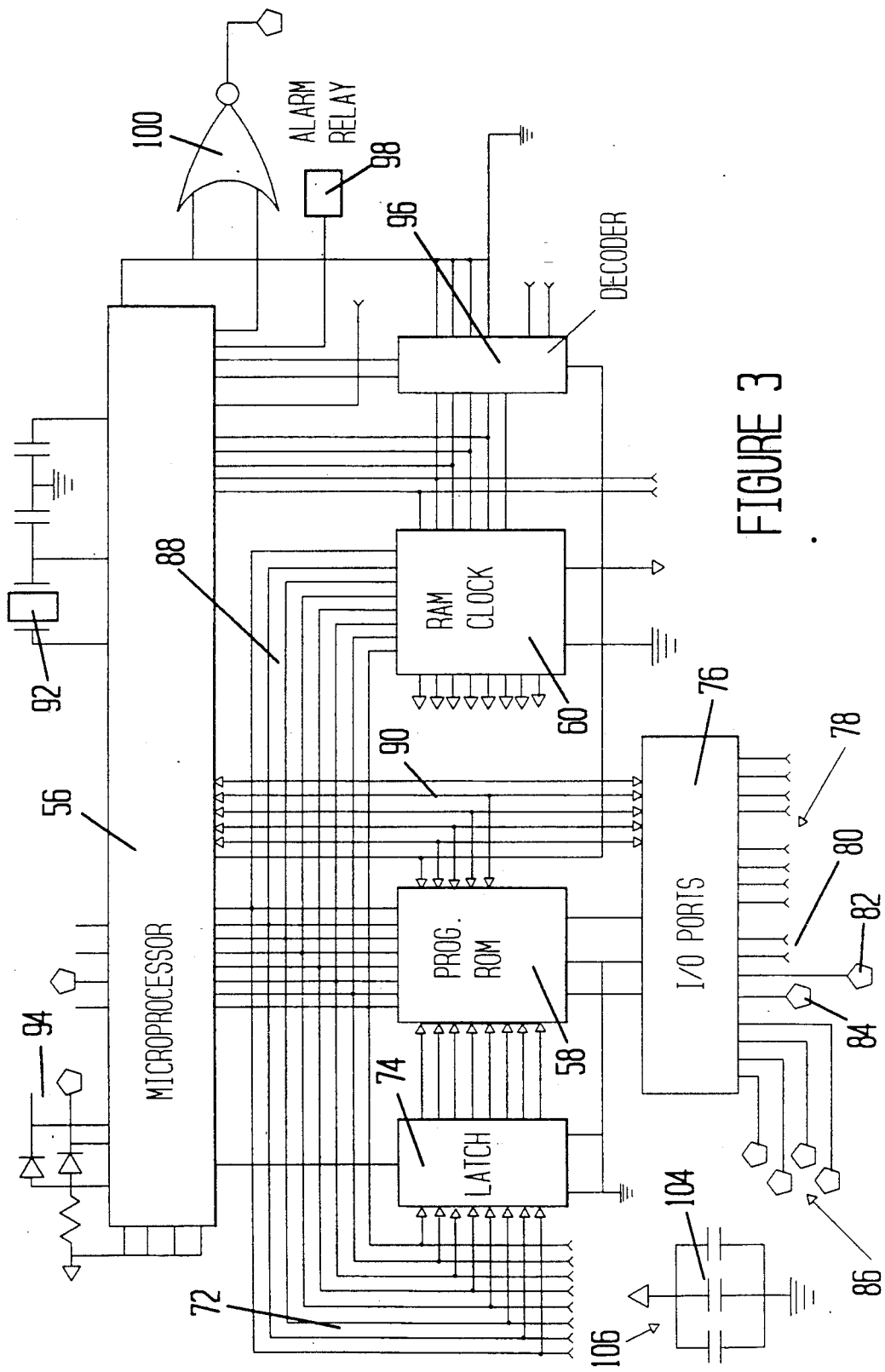
FIG. 3 is a diagram of the microprocessor used in the invention and its peripheral support elements.

Referring now to FIG. 3, there is illustrated the micro-processor 56 and its peripheral elements. The micro-processor has an eight bit address data bus 72 which connects to a latch 74 and to the program ROM 58 previously mentioned. The program ROM 58 contains 4096 bytes of storage for the operating software of the micro-processor 56. The micro-processor 56 has I/O ports 76 which have eight connections 78 to the key pad, two connections to the emergency battery relay 80 and a connection 82 to the printer motor and the other connection 84 to the printer impact control. Finally, four connections 86 are provided for the liquid crystal display 62. The system ram 60 of non-volatile memory or storage of the system has 2048 bytes of non-volatile storage and contains an internal clock and emergency power supply. The signals from the system ram 60 are applied to the micro-processor 56 through the 8-bit address data bus 88. The program ROM 58 also has a higher order address in the additional bus 90 that provides four bits above the eight bits of the data bus 72, thereby giving 12 bit memory to the system to handle the 4096 bytes of program ROM.

The micro-processor 56 has a standard crystal 92 which is set at 6 megahertz operation. A feedback circuit 94 is provided for supplying interrupt signals from the printer to interrupt printer output signals during operation of the printer and to maintain the printer impact wheel synchronized with the output signals.

The micro-processor 56 has a decoder 96, and an alarm relay 98, which activates a remote audio alarm to the user. Additionally, the micro-processor 56 produces signals which are applied to the NOR gate 100 that is used as a buffer/amplifier to drive an alarm LED 102 which is located on the instrument panel (see FIG. 6). Decoupling capacitors 104 are located throughout the circuit, and are shown symbolically at 106.

Referring now to FIG. 4, there is illustrated the analog to digital convertor 24 of the instrument. As there illustrated, the analog to digital convertor 24 receives a direct current signal from the voltage sensor through line 14, a discharge current signal from the DC current sensor through line 32, a temperature signal from the temperature sensor through line 38 and an emergency battery supply signal through line 108 from the emergency battery 42 of the instrument. The convertor 24 also receives a DC current signal representative of the charging current for the batteries through line 34. Three additional or spare inputs 110 are provided which are unused in the current configuration of the instrument.

The precision voltage reference source 52 provides a reference voltage of 5.000 volts to the analog to digital convertor and also provides a 2.500 volt signal which, as previously mentioned is applied through a zero adjustment circuit 54 to the current discriminator 28 (see FIG. 2). The analog to digital convertor 24 also generates an end-of-conversion signal which is applied through line 112 to the micro-processor 56 at terminal X which is shown in FIG. 3.

Two NOR gates 114 are provided as buffer decoders and constitute a portion of the decoder and buffers 64 shown in FIG. 2. These, together with other support circuitry, provide the necessary operating voltages and current for the analog to digital convertor 24.

The analog to digital convertor 24 has a bi-directional 8 bit address bus 116 with an additional three terminals to provide additional functions for the data bus. The remaining support circuitry for the analog to digital convertor includes a flip flop 118 which is used as a frequency divider and which is provided with a 5-volt signal and which sends a voltage operating signal through line 120 to the analog to digital convertor 24.

FIG. 5 shows the key pad 122 of the invention which is connected to a 5 volt bus 124 through pull up resistors 126. The terminals 128 of the key pad are connected to the terminals 78 shown on FIG. 3. The key pad 122 also has a plug in printed circuit card with a ribbon connector to connect to the 8 functional keys 130 of the key pad, all of which provide an interruptible ground to the 5-volt reference voltage from the 5-volt supply bus.

Figure 6:
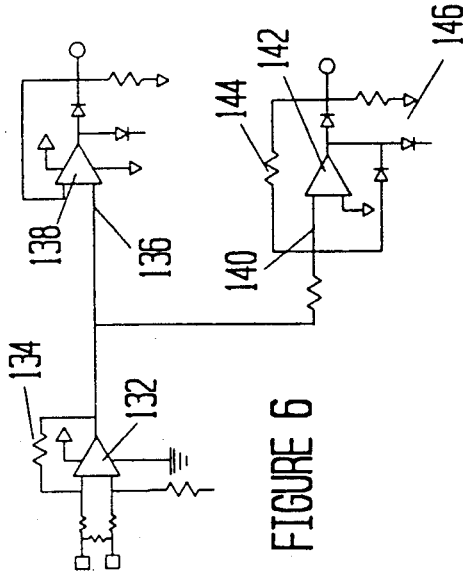
FIG. 6 is a circuit diagram of the discriminating amplifier circuit used in the invention.

Referring now to FIG. 6, there is illustrated the current discriminator 28 which is used in the invention for sensing and providing the necessary gain to the current signals applied to the analog to digital convertor 24. The input signal from the Hall effect current sensor 26 is applied through an operational differential amplifier 132 having a feedback resistor 134 of a set value to provide a predetermined gain. The output signal from the differential amplifier 132 will be positive during battery discharge and will be negative during battery charging. This signal is applied to the non-inverting terminal 136 of the discriminating amplifier 138 which operates as a follower and which passes only the positive voltage signal to the analog to digital convertor 24. The signal is also applied to the inverting terminal 140 of the operational amplifier 142. This amplifier has a resistor 144 to provide a preset gain and has a diode bridge 146 which functions as a voltage limiter to maintain the voltage signal which is generated below 5.5 volts. When the output signal from the operational amplifier 142 goes negative, the diode bridge 146 will clamp the current through the resistor and thereby limit the maximum voltage of the generated signal to no greater than 5.5 volts.

Figure 7:
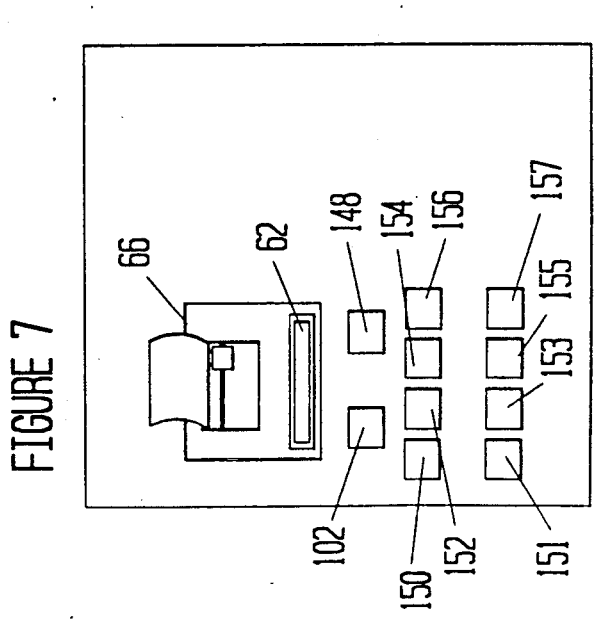
FIG. 7 is a view of the front panel of the monitoring instrument.

The operating software of the instrument is set to control the operation and record and monitor various functions. The instrument panel, which is shown in FIG. 7, supports the printer 66 and the display 62, previously mentioned. It also has an LED 102 for an alarm which indicates, during battery discharge, if the battery voltage falls below the preset minimum value for safe operation. The panel also has an LED 148 to indicate operation of the temperature sensor 36. The instrument has four monitoring inputs which are ALARM RESET, 150, PAPER FEED, 152, TEST PRINT, 154 and DISPLAY SELECT, 156; and four calibrating inputs; CAL MODE, 151, which initiates and advances through the calibrating cycle; SET+, 153, which increases the value of a displayed number; SET-155, which decreases the value of a displayed number; and MEMORY SET, 157, which enters a display into memory.

The calibrating inputs can be used to adjust any of the various functions which are displayed on the LED display 62. The functions which are displayed include the year, month and day and the time in hours, minutes and seconds on a 24-hour clock. Also displayed in sequence is the discharge threshold voltage which starts the printout from the printer 66 whenever the voltage falls below the preset voltage. During calibration this voltage is set to a value which is determined by multiplying the number of battery cells which are connected in series times 2.03 volts for lead acid batteries and 1.22 volts for nickel cadmium batteries.

The fourth step of calibration is to set the charge threshold which is the voltage to trigger the recording of any voltage which exceeds the preset voltage for charging. This is set 5 volts higher than the discharge threshold voltage previously determined in the prior setting.

The fifth calibration step is to set the cut-out threshold voltage which is set 25 volts below the lowest discharge ending voltage for the system. This ending voltage is a predetermined minimal voltage necessary for safe operation of computers or other critical loads which will otherwise fail when the battery falls below the preset value. The function of the cut-out threshold voltage is to stop operation of the printer in the event the sensed voltage falls below the cut-out threshold voltage.

The next calibration step is to compare the battery voltage with an accurate digital meter and to correct the sensed voltage if necessary to that determined with the accurate digital meter. The seventh calibration step is to zero the current sensor determination and this is done by removing the current sensor from the circuit and setting the instrument to zero amps.

The eighth calibration step is to compare the sensed and reported current during battery recharging cycles and this is done by comparing the instrument's reading with an accurate current sensor and adjusting the instrument if necessary to that determined with an accurate current sensor.

The ninth calibration step is to set the discharge amps and this is determined during battery discharge cycles by comparing the display reading with an accurate current sensor determination and correcting the instrument if necessary.

The tenth calibration step is to compare the display temperature with that reported by an accurate thermometer, correcting if necessary.

The eleventh calibration step is to set the print delay which is the desired time in minutes between printout during battery discharge. Typically a one minute delay is used for a 10 minute battery and ten minutes for an 8 hour battery.

Finally, the last calibration step is to set a code unit to identify the printout in the event that the instrument is used for sensing more than one installation.

The operational controls of the instrument include the key pad inputs 150, 152, 154 and 156. The first is ALARM RESET 150 which, when pressed, resets the alarm lamp and the audio alarm so that the alarm is only activated when a battery discharge occurs. The next input from the key pad PAPER FEED, 152, to advance the paper through the printer. The third input, TEST PRINT, 154, which starts the printout of the date, time, battery ambient temperature and charge voltage and current. The fourth input. DISPLAY SELECT, 156, selects any of six displays on the LED 62.

The first selectable display is of the battery voltage and battery amps which is useful in observing the battery during its charge and discharge modes. The second selectable display is the ambient battery temperature which is displayed in both fahrenheit and centigrade temperature units. The next selectable display is the internal battery voltage which should be checked every month. Typically the internal battery voltage will be from 13.55 to 13.81 volts. The fourth selectable display shows the elapsed charge and discharge time and the battery voltage.

The fifth selectable display is the time displayed on the internal 24 hour clock and the last selectable display is the date on the internal calendar of the system.

Figures 8, 9, 10:
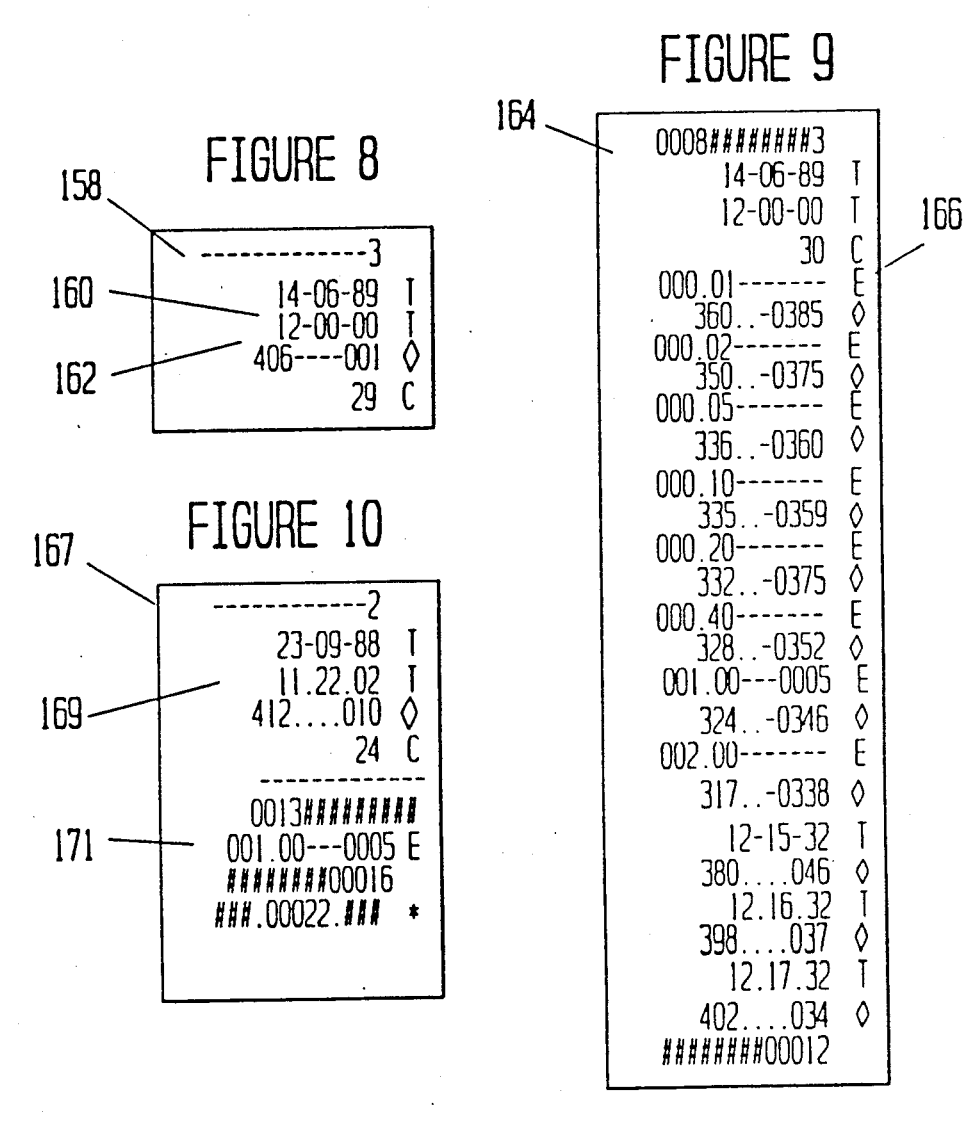

FIG. 8 illustrates a typical 24 hour or manual printout 158 from the instrument. The printout 158 starts with the selected unit number (3) identifying the specific unit being monitored, a line entry 160 for the day, month and year and a following entry 162 for the time in hours, minutes and seconds. The voltage (406 v) and current (1 amp.) are then displayed and the ambient temperature (29° C.) is displayed.

FIG. 9 illustrates a typical battery discharge printout 164 which will occur automatically on any battery discharge. The first line reports the unit number which identifies the battery unit being monitored, the next line the date, the next line the time and the fourth line the ambient battery room temperature. The next line 166 reports the elapsed discharge time followed by the voltage (360 v) and discharge current (385 amps). The following lines report the battery voltages and currents after selected elapsed discharge times, in this case, after 2, 5, 10, 20 and 40 seconds, and after 1 and 2 minutes.

Finally, the time (12-15-32), voltage (317 v) and current (46 amps) are reported at the beginning of the recharge cycle, and these reports continue each minute during the recharge operation.

The instrument also provides status information of the batteries during the "test print" operation. A sample of a test print tape is shown in FIG. 10. The tape 167 has a first line which reports the battery identification, followed with the standard day, month, year, hour, minute and second information. The battery voltage (412 v), current (10 amp) and temperature (29° C.) are then reported. The test tape also prints out the stored memory of the instrument. In the illustration, this includes a report of the total accumulated number of battery discharges (13), followed by a report of the total accumulated number of battery discharges lasting one minute or more (5), the total accumulated battery discharge time (16 minutes), and the total accumulated battery discharge kilowatt hours (22).

In other applications, the instrument can be set to record other useful information such as total accumulated number of battery discharges lasting 30 seconds or less, total accumulated number of battery discharges more than 30 seconds and less than 5 minutes, and total accumulated battery discharges lasting 5 minutes or more. Also included are: total accumulated battery discharge time in minutes and total accumulated battery discharge power in kilowatt-hours. The instrument is entirely adjustable to provide whatever records of battery discharge or charge conditions are desired or required by the battery manufacturer, depending on the operating software (program rom 58) supplied with the instrument.

Figure 11:
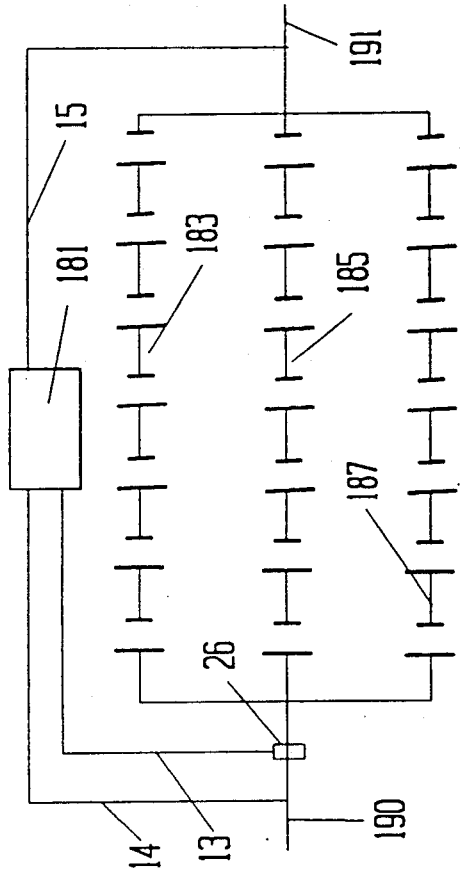
FIG. 11 is a circuit diagram of the installation of the system of the invention.
Figure 12:
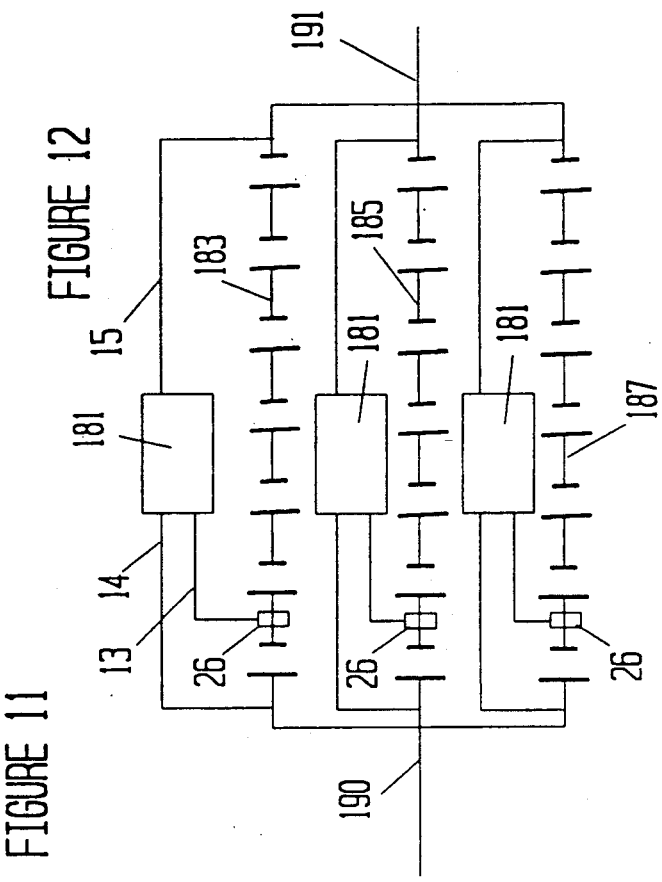
FIG. 12 is a circuit diagram of an alternate installation of the system of the invention.

Referring now to FIGS. 11 and 12, the instrument installation will be described. In a typical UPS system, the batteries are provided in parallel legs 183, 185 and 187 of a multiple-legged power supply having power leads 190 and 191. The instrument can be placed on the power leads 190 and 191 as shown in FIG. 11, in which the voltage leads 14 and 15 are placed between the negative and positive terminals of the entire UPS system, and the current sensor 26 is placed about one power lead. In any installation, a temperature sensor 36 can be located in a centrally located battery cell to record the ambient temperature. A plurality of temperature sensors can be used in special installations, however, in most applications, a single cell is selected as the "pilot" cell and a temperature probe is located in the electrolyte of the pilot cell to monitor the temperature of the entire battery system.

Alternatively, the voltage leads 14 and 15, and the current sensor 26 can be clamped about one of the legs of a multiple legged power supply such as the central leg 185.

FIG. 12 illustrates a preferred installation in which separate instruments 181 are placed on each of the parallel legs 183, 185 and 187. This provides the most accurate monitoring of the system. Alternatively, the analog to digital converter 24 has three unused input leads 110 (see FIG. 4), and these leads can be ulitized to provide for separate inputs from each of the legs 185 and 187, thereby providing an installation in which a single instrument can monitor all three legs. This would only require duplication of gain amplifier 22, current sensor 26, current discriminator 28, and gain amplifier 30 for each of the legs which are monitored.

The invention provides the advantages of constant monitoring of battery condition without removing the batteries from emergency standby operation. Since the batteries are monitored during actual discharge operation, there is no chance that the battery test conditions are atypical, or are not representative of actual discharge conditions. The invention also provides a monitoring and recording of all information considered significant by battery manufacturers in reviewing warranty claims and servicing of the batteries. Since the instrument is controlled by operational commands which are stored in the program rom, the operation of the instrument can be adjusted by substitution of other program rom modules. This provides a flexibility to meet any particular battery manufacturer's requirements for operational data.

The invention has been described with reference to the illustrated and presently preferred embodiment. It is not intended that the invention be unduly limited by this disclosure of the presently preferred embodiment. Instead, it is intended that the invention be defined, by the means, and their obvious equivalents, set forth in the following claims:

What is claimed is:

1. A battery monitoring system to detect and record conditions of a rechargeable battery utilized in a standby mode, in an emergency power discharging mode and in a charging mode, which comprises:
    a) detection means including battery voltage detection means; battery current detection means; clock means; and ambient battery temperature detection means;
    b) computer means receiving detection signals from each of said detection means during said stand-by, charging and discharging modes, and operative to provide output signals of:
        (1) instantaneous battery voltage and current;
        (2) date and time of said instantaneous signals of battery voltage and current; and
        (3) battery temperature;
    c) summation means operatively associated with said computer means to prepare and provide output total use signals for each of the following:
        (4) total accumulated number of discharge uses;
        (5) total accumulated number of discharge uses lasting over a first predetermined time period;
        (6) total of lapsed minutes of discharge uses; and
        (7) total accumulated battery discharge power;
    d) incipient battery failure detection means including:
        (8) storage means to receive a preset end voltage selected by the user and representing the minimal permissible voltage for useful operation;
        (9) comparator means receiving the detected instantaneous battery voltage during discharge; and
        (10) alarm means to indicate a deteriorated battery condition when said instantaneous battery voltage decreases below said preset end voltage; and
    e) recording means to record said detection signals and said total use signals.

2. The battery monitoring system of claim 1 wherein said summation means also includes means to output total accumulated number of discharge uses lasting over a second predetermined time period.

3. The battery monitoring system of claim 2 wherein said summation means also includes means to output total accumulated number of discharge uses lasting over a third predetermined time period.

4. The battery monitoring system of claim 1 including printer means to prepare a printed record of said instantaneous signals and total use signals.

5. The battery monitoring system of claim 2 wherein said recording means is operative to record said instantaneous signals and total use signals once each 24 hours while said battery is in its standby mode.

6. The battery monitoring system of claim 1 including a visual display means to continuously display said detected signals.

7. The battery monitoring system of claim 6 wherein said display means displays date, time of day, voltage, charging amperes, and discharging amperes.

8. The battery monitoring system of claim 1 including electric current detection means to generate a signal representing instantaneous current flow during said discharge and charge modes.

* * * * *